United States Patent
Nakahara et al.

(10) Patent No.: US 8,247,793 B2
(45) Date of Patent: Aug. 21, 2012

(54) ZNO-BASED THIN FILM AND ZNO-BASED SEMICONDUCTOR ELEMENT

(75) Inventors: Ken Nakahara, Kyoto (JP); Shunsuke Akasaka, Kyoto (JP); Masashi Kawasaki, Miyagi (JP); Akira Ohtomo, Miyagi (JP); Atsushi Tsukazaki, Miyagi (JP)

(73) Assignee: Rohm Co., Ltd., Kyoto (JP)

( * ) Notice: Subject to any disclaimer, the term of this patent is extended or adjusted under 35 U.S.C. 154(b) by 128 days.

(21) Appl. No.: 12/664,397

(22) PCT Filed: Jun. 13, 2008

(86) PCT No.: PCT/JP2008/060831
§ 371 (c)(1),
(2), (4) Date: May 25, 2010

(87) PCT Pub. No.: WO2008/153121
PCT Pub. Date: Dec. 18, 2008

(65) Prior Publication Data
US 2010/0289004 A1  Nov. 18, 2010

(30) Foreign Application Priority Data

Jun. 13, 2007 (JP) .................... 2007-156160
Jan. 15, 2008 (JP) .................... 2008-005975

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)
*H01L 29/08* (2006.01)
*H01L 29/10* (2006.01)
*H01L 29/12* (2006.01)

(52) U.S. Cl. ............... 257/15; 257/9; 257/22; 257/29; 257/43; 257/E29.072; 257/E29.073; 257/E29.074; 257/E29.075; 257/E29.076; 257/E29.077; 257/E29.078; 257/E31.036; 257/E33.01

(58) Field of Classification Search ............ 257/9, 15, 257/22, 29, E29.072, E29.073, E29.074, 257/E29.075, E29.076, E29.077, E29.078, 257/E31.036, E33.01, 43
See application file for complete search history.

(56) References Cited

U.S. PATENT DOCUMENTS 6,057,561 A * 5/2000 Kawasaki et al. ............... 257/94
(Continued)

FOREIGN PATENT DOCUMENTS

JP  2001-287998 A  10/2001
(Continued)

OTHER PUBLICATIONS

Atsushi Tsukazaki et. al., "Blue Light-Emitting Diode based on ZnO", Japanese Journal of Applied Physics, vol. 44, No. 21, 2005, pp. L643-L645.
(Continued)

*Primary Examiner* — Ida M Soward
(74) *Attorney, Agent, or Firm* — Rabin & Berdo, P.C.

(57) ABSTRACT

Provided are a ZnO-based thin film and a ZnO-based semiconductor device which allow: reduction in a burden on a manufacturing apparatus; improvement of controllability and reproducibility of doping; and obtaining p-type conduction without changing a crystalline structure. In order to be formed into a p-type ZnO-based thin film, a ZnO-based thin film is formed by employing as a basic structure a superlattice structure of a MgZnO/ZnO super lattice layer 3. This superlattice component is formed with a laminated structure which includes acceptor-doped MgZnO layers 3b and acceptor-doped ZnO layers 3a. Hence, it is possible to improve controllability and reproducibility of the doping, and to prevent a change in a crystalline structure due to a doping material.

8 Claims, 6 Drawing Sheets

U.S. PATENT DOCUMENTS

| | | | | |
|---|---|---|---|---|
| 7,132,691 | B1 * | 11/2006 | Tanabe et al. | 257/79 |
| 7,821,019 | B2 * | 10/2010 | Osinsky et al. | 257/97 |
| 7,834,371 | B2 * | 11/2010 | Sano et al. | 257/98 |
| 7,960,727 | B2 * | 6/2011 | Nakahara et al. | 257/43 |
| 2009/0267062 | A1 * | 10/2009 | Nakahara et al. | 257/43 |
| 2010/0264411 | A1 * | 10/2010 | Fujii et al. | 257/43 |
| 2011/0027922 | A1 * | 2/2011 | Sano et al. | 438/27 |

FOREIGN PATENT DOCUMENTS

| | | | |
|---|---|---|---|
| JP | 2004095634 A | * | 3/2004 |
| JP | 2004-221132 A | | 8/2004 |
| JP | 2004-247465 A | | 9/2004 |
| JP | 2004-349600 A | | 12/2004 |

OTHER PUBLICATIONS

K. Nakahara et. al., "Growth of N-doped and Ga + N-codoped ZnO films by radical source molecular beam epitaxy", Journal of Crystal Growth 237-239 (2002) 503-508.

Atsushi Tsukazaki, et. al., "Repeated temperature modulation epitaxy for p-type doping and light-emitting diode based on ZnO", nature materials, advance online publication, www.nature.com/naturematerials, published online Dec. 19, 2004.

Toshio Kamiya, "Transparent Oxide Semiconductor: New Frontier of Material Science", Special Edition, Transparent Oxide Semiconductor: New Frontier of Material Science, vol. 25, No. 4, pp. 10-21 (2005).

* cited by examiner

ZNO-BASED THIN FILM AND ZNO-BASED SEMICONDUCTOR ELEMENT

TECHNICAL FIELD

The present invention relates to an acceptor-doped ZnO-based thin film and a ZnO-based semiconductor device.

BACKGROUND ART

Studies have been made on application of a ZnO-based semiconductor device using ZnO, which is a type of oxide, to an ultraviolet LED used as a light source for illumination, backlight or the like, a high-speed electronic device, a surface acoustic wave device, and so forth. ZnO has drawn attention to its versatility, large light emission potential and the like. However, no significant development has been made on ZnO as a semiconductor device material. The largest obstacle is that p-type ZnO cannot be obtained because of difficulty in acceptor doping. Nevertheless, as demonstrated by Non-patent Documents 1 and 2, technological progress of recent years has made it possible to produce p-type ZnO, and has proven that light is emitted from the p-type ZnO. Accordingly, active research on ZnO is underway.

A proposal has been made on use of nitrogen as an acceptor for obtaining p-type ZnO. As disclosed in Non-patent Document 3, when ZnO is doped with nitrogen as an acceptor, the temperature of the substrate needs to be lowered because the efficiency of nitrogen doping heavily depends on a growth temperature. However, the lowering of the substrate temperature degrades crystallinity, and forms a carrier compensation center that compensates the acceptor. As a result, nitrogen is not activated. This makes the formation of a p-type ZnO semiconductor layer, itself, extremely difficult.

With this taken into consideration, Non-patent Document has disclosed a method of forming a p-type ZnO-based semiconductor layer with a high carrier density by using a –C plane as a main surface for growth under such temperature control that a growth temperature is alternately changed between 400° C. and 1000° C., the method thereby taking advantage of the temperature dependency of the efficiency of nitrogen doping. However, this method involves the following problems. The continuous process of heating and cooling results in the alternate repetition of thermal expansion and contraction of the manufacturing machine. This imposes heavy burden on the manufacturing machine. For this reason, the manufacturing machine requires an extensive configuration, and periodic maintenance service at shorter intervals. Furthermore, the method requires the temperature to be accurately controlled because the doping amount is determined by a part of the process at the lower temperature. However, it is difficult to control the temperature so that the temperature will reach 400° C. and 1000° C. accurately in a short time period, and the reproducibility and stability of the doping thus become inadequate. Further, since the method uses a laser as a heating source, the method is not suitable for heating a large area. In addition, it is difficult to grow multiple semiconductor films, although the growth of multiple semiconductor films is needed to reduce device manufacturing costs.

Non-patent Document 1: A. Tsukazaki et al., Japanese Journal of Applied Physics vol. 44 (2005) L643.
Non-patent Document 2: A. Tsukazaki et al., Nature Material vol. 4 (2005) 42.
Non-patent Document 3: K. Nakahara et al., Journal of Crystal Growth 237-239 (2002) p. 503.
Non-patent Document 4: Toshio Kamiya, "High-performance Materials", Vol. 24 No. 4, Chapter II "Transparent oxide semiconductor: A new frontier opened by transparent conductive oxides."

DISCLOSURE OF THE INVENTION

Problem to be Solved by the Invention

In order to solve the above-described problems with the prior art, studies have been made on another method of manufacturing p-type ZnO as well. As described in Non-patent Document 4, a Cu (copper)-based compound oxide is p-type conductor which is rare among oxides.

The above document discloses a reason why it tends to be difficult to form p-type metal oxides. In many metal oxides, a valence band is composed of the oxygen 2p orbital exhibiting stronger localization. When the localization is stronger, an effective mass is heavier because the dispersion of the valence band is smaller. As a consequence, the carrier movement is restricted, and this makes it difficult to achieve hole conduction. With this taken into consideration, the method disclosed in Non-patent Document 4 attempts to make the dispersion of the valence band larger by use of the Cu 3d orbital which is close to the oxygen 2p orbital in terms of energy, and which is therefore apt to form a hybrid orbital.

The method disclosed in Non-patent Document 4 requires Cu to be mixed in an amount equivalent to oxygen, and this mixture changes the crystalline structure. For this reason, in a case where the above-described method is applied to a ZnO thin film, it is difficult to use the resultant ZnO-based thin film for a semiconductor device which is intended to have a new function by laminating thin film, although the change in the crystalline structure does not matter as long as the resultant ZnO-based thin film is used alone. This is because the laminating of thin films having different crystalline systems induces various factors, which impede device operations, such as generation of an interface state, lamination defects and misfit dislocation.

The present invention has been made to solve the above-described problems. An object of the present invention is to provide a ZnO-based thin film and a ZnO-based semiconductor device which allow: reduction in a burden on a manufacturing apparatus; improvement of controllability and reproducibility of doping; and obtaining p-type conduction without changing a crystalline structure.

Means for Solving the Problem

For the purpose of fulfilling the object, the invention according to claim 1 is a ZnO-based thin film, which is a superlattice component, including a laminated structure of a MgZnO layer and a ZnO layer. At least one layers of the MgZnO layers and the ZnO layers are doped with an acceptor.

The invention according claim 2 is the ZnO-based thin film according to claim 1, in which: the layer doped with the acceptor is the MgZnO layer; and the other layer, which is the ZnO layer, is not doped intentionally with the acceptor.

The invention according to claim 3 is the ZnO-based thin film according to any one of claims 1 and 2, in which a Mg composition ratio of the MgZnO layer is not higher than 50%.

The invention according to claim 4 is the ZnO-based thin film according to any one of claims 1 and 2, in which a Mg composition ratio of the MgZnO layer is not higher than 30%.

The invention according to claim 5 is the ZnO-based thin film according to any one of claims 1 to 4, in which film thicknesses of the respective layers in the superlattice component are not more than 10 nm.

The invention according to claim 6 is the ZnO-based thin film according to any one of claims 1 to 5, in which the acceptor is any one of nitrogen and copper.

The invention according to claim 7 is a ZnO-based semiconductor device including a laminated body containing ZnO-based semiconductor in which the ZnO-based thin film according to any one of claims 1 to 6 is used as a p-type layer.

The invention according to claim 8 is the ZnO-based semiconductor device according to claim 7, in which the superlattice component is deposited on a $Mg_YZn_{1-Y}O$ ($0 \leq Y < 1$) substrate.

Effect of the Invention

A ZnO-based thin film of the present invention has a laminated structure of a MgZnO layer and a ZnO layer, and includes a superlattice component in which at least one of the MgZnO layer and the ZnO layer is doped with an acceptor. For this reason, it is possible to change a valence band structure in the superlattice structure artificially by use of spontaneous polarization and piezoelectric polarization possessed by a ZnO-based crystal. Thereby, the property of small dispersion of the valence band is modified. Accordingly, it is possible to achieve p-type conduction easily. Therefore, controllability and reproducibility of the doping are improved, and it is possible to prevent the change in the crystalline structure due to a doping material. Hence, it is possible to form a desired ZnO-based semiconductor device easily.

EXPLANATION OF REFERENCE NUMERALS

Figure 1:
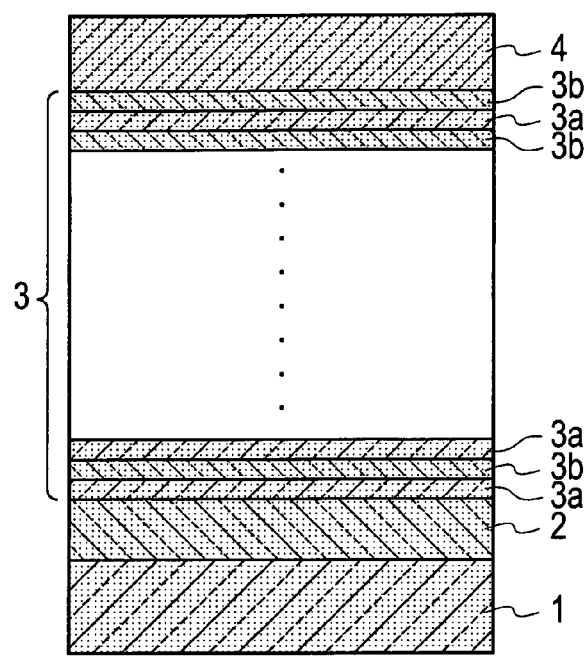
FIG. 1 shows a ZnO-based laminated body including acceptor-doped ZnO thin films of the present invention.

1 ZnO substrate
2 undoped ZnO layer
3 MgZnO/ZnO; superlattice component
3a acceptor-doped ZnO layer
3b acceptor-doped MgZnO layer
4 undoped MgZnO layer

BEST MODES FOR CARRYING OUT THE INVENTION

An embodiment of the present invention will be described below with reference to the drawings. FIG. 1 shows a configuration of a ZnO-based laminated body including a ZnO-based thin film according to an embodiment of the present invention. Here, the ZnO-based thin film is a thin film essentially containing ZnO, and is made of ZnO or a compound containing ZnO. Concrete examples of the ZnO-based thin film include: a thin film made of ZnO; a thin film made an oxide containing a IIA group element and Zn; a thin film made of an oxide containing a IIB group element and Zn; and a thin film made of an oxide containing IIA group element, a IIB group element and Zn. Examples further include mixed crystals such as $Mg_xZn_{1-x}O$ which is mixed with Mg in order to expand a band gap.

In the ZnO-based laminated body of FIG. 1, an undoped ZnO layer 2, a MgZnO/ZnO superlattice component 3 and an undoped MgZnO layer 4 are sequentially laminated on a ZnO substrate 1. This ZnO-based laminated body is made for the purpose of investigate characteristics of the MgZnO/ZnO superlattice component 3 which constitutes the ZnO-based thin film according to this embodiment of the present invention.

The MgZnO/ZnO superlattice component 3 is formed with a superlattice structure in which an acceptor-doped ZnO layer 3a and an acceptor-doped $Mg_xZn_{1-x}O$ ($0 < x \leq 0.5$) layers 3b are alternately laminated on each other. Nitrogen (N), copper (Cu) or the like is used as an acceptor with which the ZnO layers 3a and the $Mg_xZn_{1-x}O$ ($0 < x \leq 0.5$) layers 3b are doped. Not that the reason for setting the Mg composition ratio x to $0 < x \leq 0.5$ as described above is that the Mg composition ratio x which currently enables production of a uniform MgZnO mixed crystal is equal to or below 50% at this moment. In order to produce the uniform MgZnO mixed crystal more reliably, it is preferable to set the Mg composition ratio equal to or below 30%.

Meanwhile, the ZnO layer 3a is formed with a film thickness in a range of 1 to 10 nm, while the MgZnO layer 3b is formed with a film thickness in a range of 1 to 10 nm. The ZnO layer 3a and the MgZnO layer 3b are alternately laminated 10 to 100 times, and the MgZnO/ZnO superlattice component 3 is thus formed with a total thickness of around 200 nm. In this respect, the MgZnO layer 3b has a larger band gap than the ZnO layer 3a. On the other hand, the undoped ZnO layer 2 is formed with a thickness of 10 nm, and the undoped MgZnO layer 4 is formed with a thickness of 10 nm.

The acceptor doping and activation can be facilitated if it is possible to modify the valence band of the ZnO-based thin film as described previously. To this end, a valence band structure is artificially formed by forming the ZnO-based thin film with a superlattice structure as illustrated by the MgZnO/ZnO superlattice component 3. Thereby, the valence band of the ZnO-based thin film is formed with the oxygen 2p orbital, and the property of the ZnO-based thin film in which the valence band dispersion is small is accordingly modified. This makes it possible to easily obtain the p-type conduction for the ZnO-based thin film.

As long as the ZnO-based thin film is with the superlattice structure, the use of usual thin film forming techniques make it possible to easily do things such as form the ZnO-base thin film of a desired composition, and control the doping of the ZnO-based thin film as intended. The superlattice structure makes it far easier to dope the ZnO-based thin film with an acceptor than the prior art in which the ZnO-based thin film is doped with an acceptor while controlling the substrate temperature.

Figure 2:
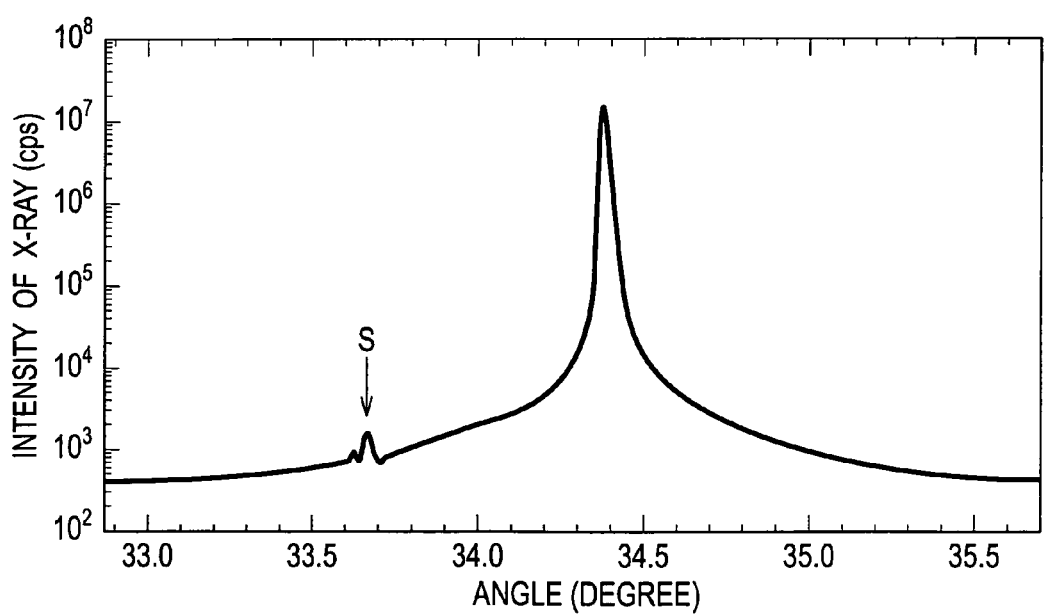
FIG. 2 is a view showing a result of an X-ray diffraction measurement of a MgZnO/ZnO superlattice component shown in FIG. 1.

FIG. 2 shows a result of an X-ray diffraction measurement (an XRD measurement) carried out by irradiating X-rays onto a surface of the MgZnO/ZnO superlattice component 3 shown in FIG. 1, which was obtained by alternately laminating the ZnO layer 3a and the MgZnO layer 3b on each other 20 times with the thickness of the ZnO layer 3a being set at 5 nm, and with the film thickness of the MgZnO layers 3b being set at 5 nm. In FIG. 2, the vertical axis indicates an X-ray intensity (count number), and the horizontal axis indicates an angle (degrees) of a detector. A detector slit was set at ⅛ degrees. A satellite peak S appeared as FIG. 2, which indicates that the superlattice structure was successfully formed.

Figure 3:
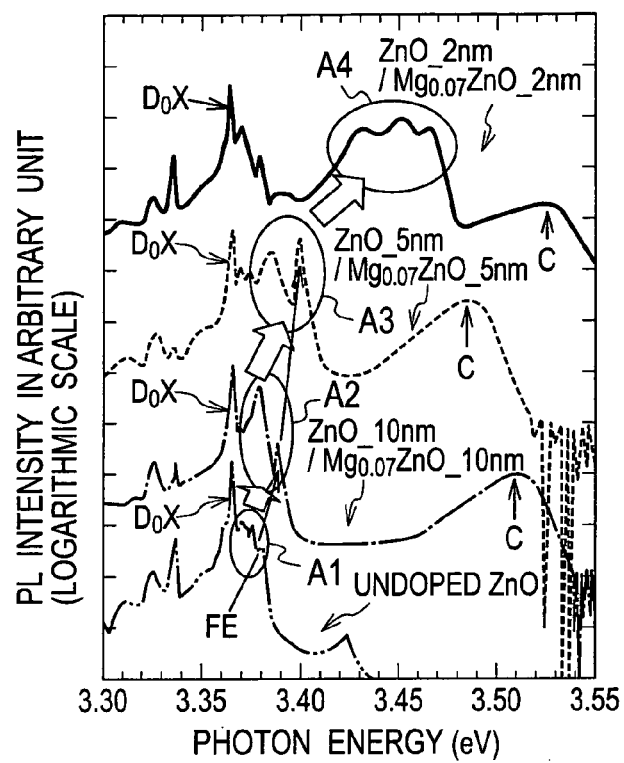
FIG. 3 is a view showing a result of a PL measurement of reference examples of an undoped MgZnO/ZnO superlattice component.

FIG. 3 shows a result of an X-ray diffraction measurement which was made on reference examples in order to confirm that the band structure was able to be modified. FIG. 3 shows a result of photoluminescence (PL) obtained by: forming a MgZnO/ZnO superlattice component as an undoped MgZnO/ZnO superlattice component which was not doped with an acceptor; subsequently cooling a ZnO-based laminated body, which included the undoped MgZnO/ZnO superlattice component as in the case of the configuration shown in FIG. 1, down to 12 K (Kelvin); and exciting the ZnO-based laminated body with a He—Cd laser. FIG. 3, the horizontal axis indicates photon energy (eV), and the vertical axis indicates an arbitrary unit (a logarithmic scale) normally used for the PL measurement. The same applies to the graphs of the PL measurements in FIGS. 4 and 5.

The Mg composition ratio of each MgZnO layer in the undoped MgZnO/ZnO superlattice component was set at 7% (the above-mentioned x=0.07). Moreover, the PL intensity measurement was performed while changing a film thickness combination of each ZnO layer and each MgZnO layer in the undoped MgZnO/ZnO superlattice component to 10 nm/10 nm, 5 nm/5 nm and 2 nm/2 nm. Note that the total film thickness of the undoped MgZnO/ZnO superlattice component was not changed but fixed to 200 nm at this time.

A lowermost curve (a curve drawn with a chain double-dashed line) represents light emission from the laminated body including an undoped ZnO single-layered layer with a film thickness of 200 nm. Moreover, as shown in the drawing, a curve drawn with a dashed line represents light emission from the ZnO-based laminated body including the undoped superlattice component in which each $Mg_{0.07}ZnO$ layer and each ZnO layer are formed with a film thickness combination of 10 nm/10 nm; a curve drawn with a dotted line represents light emission from the ZnO-based laminated body including the undoped superlattice component in which each $Mg_{0.07}ZnO$ layer and each ZnO layer are formed with a film thickness combination of 5 nm/5 nm; and a curve drawn with a solid line represents light emission from the ZnO-based laminated body including the undoped superlattice component in which each $Mg_{0.07}ZnO$ layer and each ZnO layer are formed with a film thickness combination of 2 nm/2 nm.

The highest peak in each curve represents neutral donor bound exciton (DoX) emission which is normally observed in ZnO. Portions A1 to A4 surrounded by circles represent luminescent lines at portions closest to band ends in the DoX and free exciton (FE) regions. At a glance it is obvious that light emissions at these portions were significantly changed by formation of the superlattice. As apparent from changes at portions linked with thin arrows in the drawings, intensities increased in the FE regions, and the band structures of ZnO accordingly changed.

Particularly when the film thickness combination was 2 nm/2 nm, a structure that was different from an extended line of the luminescent line of MgZnO and an extended line of the luminescent line of ZnO was observed. By giving consideration to a Bohr radius of the exciton of ZnO which is assumed to be equal to 3 nm, one may consider the reason for such an aspect is that wave functions of the excitons in mutually adjacent ZnO well layers overlap each other when the film thickness is close to 2 nm.

Figure 4:
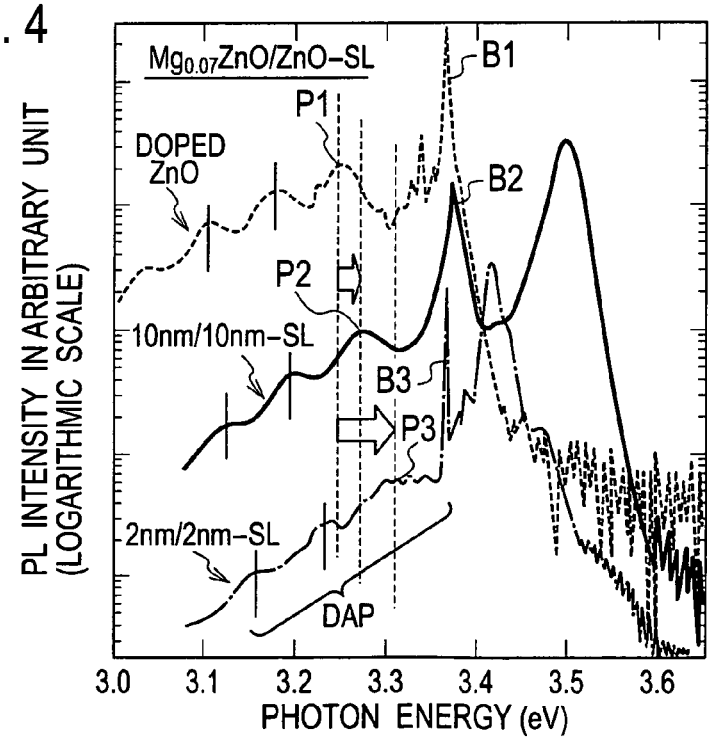
FIG. 4 is a view showing a result of a PL measurement of examples of an acceptor-doped MgZnO/ZnO superlattice component shown FIG. 1.
Figure 5:
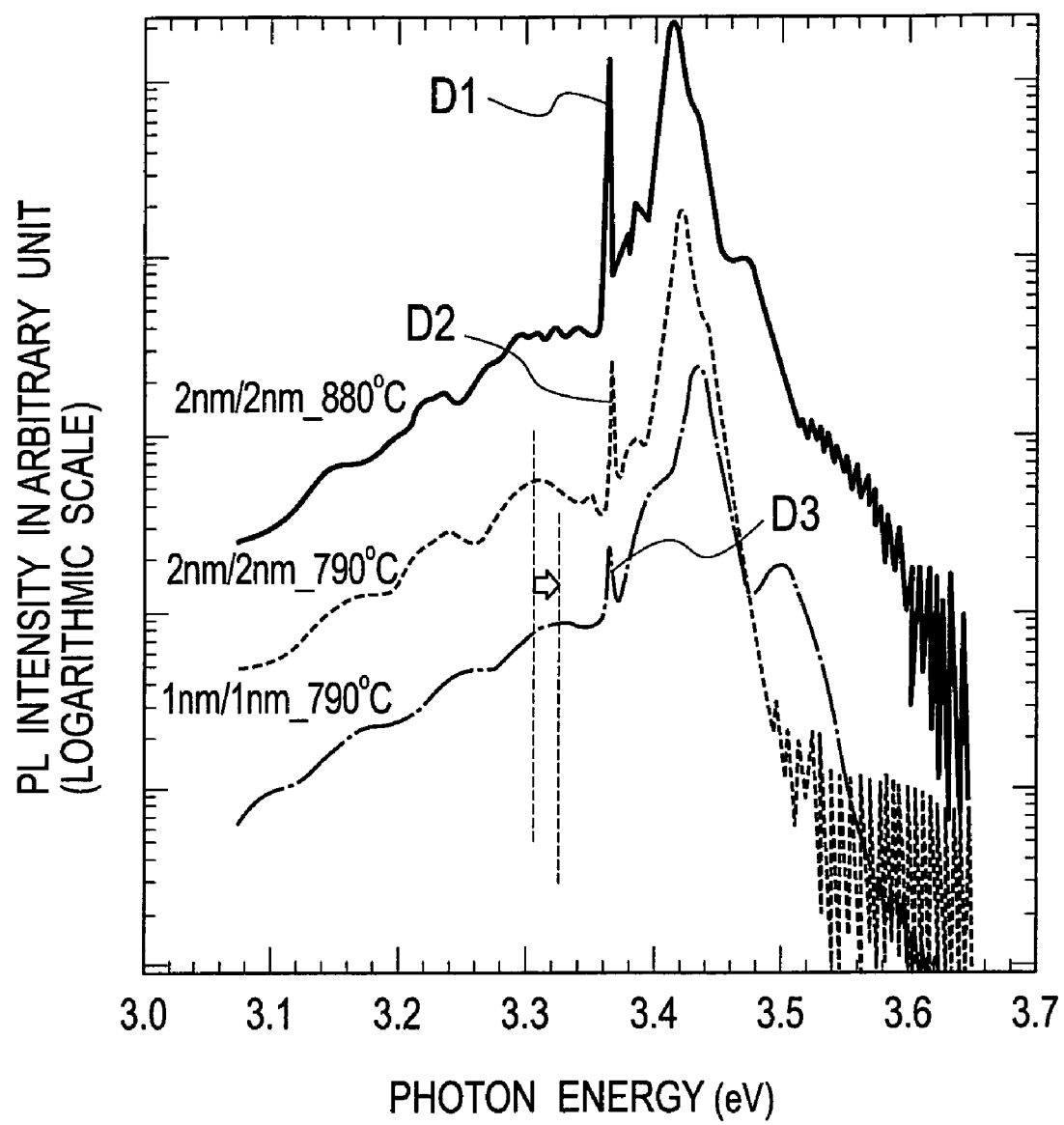
FIG. 5 is a view showing a result of a PL measurement of other examples of the acceptor-doped MgZnO/ZnO superlattice component shown in FIG. 1.

Next, FIGS. 4 and 5 show results of photoluminescence (PL) obtained by: doping the layers in the MgZnO/ZnO superlattice component 3 with nitrogen as an acceptor; subsequently cooling the laminated body, which includes the doped MgZnO/ZnO superlattice component 3 as in the case of the configuration shown in FIG. 1, down to 12 K; and exciting the laminated body with the He—Cd laser. First, as shown in FIG. 4, a curve drawn with a dashed line represents light emission from the laminated body as shown in FIG. 1 which includes the nitrogen-doped superlattice component 3 in which each $Mg_{0.07}ZnO$ layer and each ZnO layer are formed with a film thickness combination of 2 nm/2 nm; a curve drawn with a solid line represents light emission from the laminated body as shown in FIG. 1 which includes the nitrogen-doped superlattice component 3 in which each $Mg_{0.07}ZnO$ layer and each ZnO layer are formed with a film thickness combination of 10 nm/10 nm; and a curved with a dotted line represents light emission from the laminated body including a nitrogen-doped ZnO single-layered layer. In each case, the total film thickness of the nitrogen-doped MgZnO/ZnO superlattice component 3 was fixed to 200 nm. Meanwhile, a nitrogen doping concentration was set in a range of about $3\times10^{18}$ cm$^{-3}$ to $3\times10^{18}$ cm$^{-3}$ ($1\times10^{18}$ cm$^{-3}$, for example).

Donor acceptor pair (DAP) emission, which is often seen ordinarily, was clearly observed in each of the nitrogen-doped superlattice component and the nitrogen-doped single-layered layer. The effect of the superlattice is evident in these DAP emissions. In FIG. 4, P1 indicates a ZPL (zero phonon line) which represents a peak on the highest energy side of the DAP in the laminated body including the nitrogen-doped ZnO single-layered layer; P2, in the laminated body including the nitrogen-doped MgZnO/ZnO superlattice component 3 in which each $Mg_{0.07}ZnO$ layer and each ZnO layer are formed with a film thickness combination of 10 nm/10 nm; and P3, in the laminated body including the nitrogen-doped MgZnO/ZnO superlattice component 3 in which each $Mg_{0.07}ZnO$ layer and each ZnO layer are formed with a film thickness combination of 2 nm/2 nm. Blue-shift in ZPL (toward the higher energy side) is noticeable. Incidentally, a position of DAP emission is determined as follows.

The energy of DAP emission $E_{DAP}$ can be expressed with $$E_{DAP}=E_G-E_D-E_A+(e^2/4\pi\epsilon_0\epsilon_r r_{DA})-(mh\omega_{LO}/2\pi)$$

where $E_G$ denotes the minimum excitation energy; $E_D$ denotes the donor level; $E_A$ denotes the acceptor level; $r_{DA}$ denotes a distance between the donor and the acceptor; $\epsilon_0$ denotes the permittivity of vacuum; $E_r$ denotes the relative permittivity is $\epsilon_r$; e denotes the electron charge; h denotes the Plank's constant; and $\omega_{LO}$ denotes the frequency of a LO (longitudinal optical) phonon. In this respect, m is an integer equal to or above 0.

The position of DAP emission is determined by the above-described equation. For this reason, the position is usually determined when the type and concentration of each of the acceptor and the donor are fixed. In the case of FIG. 4, those having the same layer structure as that shown in FIG. 1 are compared with one another except for the nitrogen-doped MgZnO/ZnO superlattice component 3. Accordingly, the blue shift in the ZPL of the DAP obviously shows the effect of the superlattice.

Moreover, the blue shift indicates a shallower acceptor level. This is apparent with the above-mentioned equation taken into consideration, because the laminated bodies have the DoX emissions at the same position and therefore are considered to have almost equal donor levels. When the acceptor level is shallower, the acceptor is easily activated. With this taken into consideration, it pan be said that the superlattice makes the acceptor be activated more easily. This is a significant effect of the superlattice. This effect makes it possible to control activation energy by use of easily controllable parameters such as a thin film made of MgZnO/ZnO, the composition of MgZnO/ZnO, and the like while keeping the nitrogen concentration at a constant level. Hence, a desired p-type ZnO-based thin film can be easily made.

Next, FIG. 5 shows a comparison between the nitrogen-doped MgZnO/ZnO superlattice component 3 each in which each $Mg_{0.07}ZnO$ layer and each ZnO layer were formed with a film thickness combination of 2 nm/2 nm and the nitrogen-doped MgZnO/ZnO superlattice component 3 in which each $Mg_{0.07}ZnO$ layer and each ZnO layer were formed with a film thickness combination of 1 nm/1 nm. Out of the nitrogen-doped MgZnO/ZnO superlattice component 3 each in which each $Mg_{0.07}ZnO$ layer and each ZnO layer were formed with a film thickness combination of 2 nm/2 nm, one nitrogen-doped MgZnO/ZnO superlattice component 3 was made at growth temperature of 880° C., and the other nitrogen-doped MgZnO/ZnO superlattice component 3 was made at growth temperature of 790° C. The nitrogen-doped MgZnO/ZnO superlattice component 3, in which each $Mg_{0.07}ZnO$ layer and each ZnO layer was formed with a film thickness combination of 1 nm/1 nm, was made at growth temperature of 790° C.

As shown in the drawing, a dashed line is a measurement curve representing the nitrogen-doped MgZnO/ZnO superlattice component which was made with the condition that: the film thickness combination was 1 nm/1 nm; and the growth temperature was 790° C. A peak D3 shows the above-described DoX emission. A dotted line is a measurement curve representing the nitrogen-doped MgZnO/ZnO superlattice component which was made with the condition that: the film thickness combination was 2 nm/2 nm; and the growth temperature was 790° C. A peak D2 shows the DoX emission. A solid line is a measurement curve representing the nitrogen-doped MgZnO/ZnO superlattice component which was made with the condition that: the film thickness combination was 2 nm/2 nm; and the growth temperature was 880° C. A peak D1 shows the DoX emission. The blue shift in the position of DAP emission attributable to the superlattice structure was still observable, even though the film thickness combination of each MgZnO layer and each ZnO layer in the superlattice component 3 was reduced from 2 nm/2 nm to its half, namely, 1 nm/1 nm.

Moreover, as apparent from a comparison in the peak level between D2 and D3, the strength of the DoX emission similarly decreased. One may consider that both an action of suppressing donor generation and an action of making the acceptor level shallower occur due to nitrogen doping. This state is extremely favorable in light of forming the ZnO-based thin film into a p-type ZnO-based thin film.

Moreover, the acceptor doping using nitrogen or the like is still effective, even when only the ZnO layers 3a or the MgZnO layers 3b are doped with the acceptor instead of doping both the ZnO layers 3a and the MgZnO layers 3b with the acceptor. Particularly when only the MgZnO layers 3b are doped with the acceptor, holes can travel inside the narrow band gaps of the ZnO layers 3a. For this reason, it is preferable that only the MgZnO layers 3b should be doped with the acceptor. Further, concerning the film thicknesses, instead of making the film thickness of each ZnO layer 3a and the film thickness of each MgZnO layer 3b equal to each other, the film thickness of each ZnO layer 3a may be thicker than that of each MgZnO layer 3b. Conversely, the film thickness of each MgZnO layer 3b may be thicker than that of each ZnO layer 3a.

Although nitrogen is used as the acceptor in the above-described examples, copper (Cu) may be used as the acceptor instead of nitrogen. In this case, the p-type conduction can be obtained more easily, because the valence band structure is artificially modified and the valence band dispersion is made larger by use of the MgZnO/ZnO superlattice component 3. Moreover, unlike the prior art, it is not necessary to mix Cu in an amount close to that of oxygen at all. Accordingly, the crystalline structure is no longer changed.

Next, descriptions will be provided for a method of manufacturing the ZnO-based laminated body of FIG. 1 which includes the MgZnO/ZnO superlattice component 3 of the present invention. A ZnO substrate 1, in which a c-axis set off in a direction of an m-axis, is used. A metal structure body configured to monitor a temperature, which is attached in accordance with the following procedures, is formed on a rear surface of the ZnO substrate 1, namely, an opposite surface of the ZnO substrate 1 from the surface on which to grow the undoped ZnO layer 2 to the undoped MgZnO layer 4.

Ti and Pt are vapor-deposited on the rear surface of the ZnO substrate 1. Ti is deposited with a thickness of about 20 to 1000 Å, while Pt is deposited with a thickness of about 50 to 10000 Å. Subsequently, adhesion between Ti and ZnO is improved by heating the resultant ZnO substrate at a temperature of 400° C. to 800° C. with a lamp heating furnace. This metal structure body has the following effect.

Figure 8:
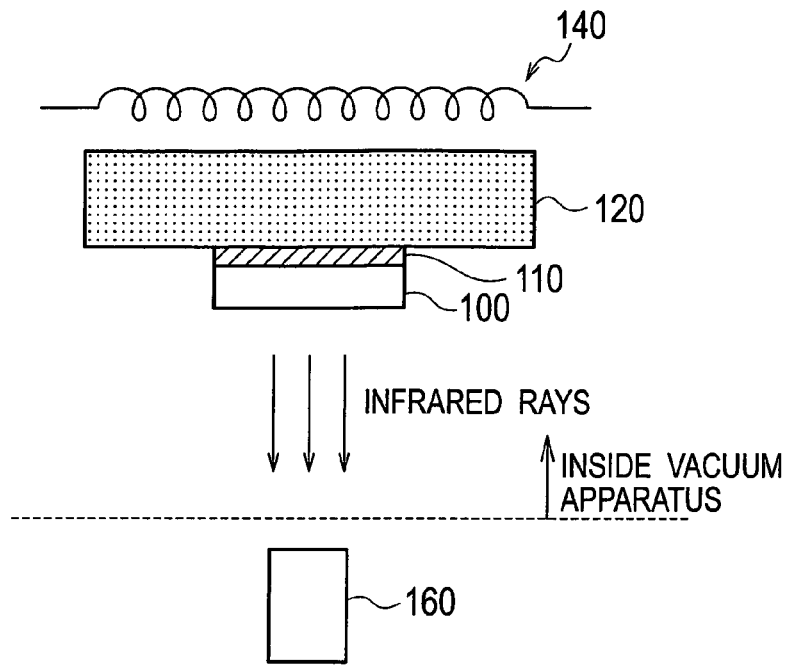
FIG. 8 is a view showing a configuration to measure a substrate temperature which is observed when growing a ZnO-based thin film.
Figure 9:
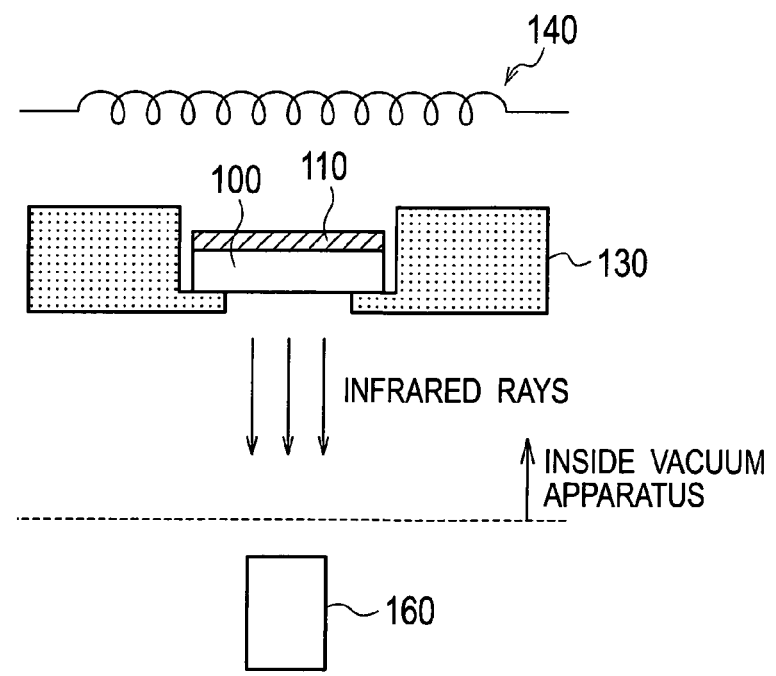
FIG. 9 is a view showing another configuration to measure the substrate temperature which is observed when growing the ZnO-based thin film.

Here, the temperature of the substrate is measured by use of a configuration shown in FIG. 8 or FIG. 9. Reference numeral 100 denotes a ZnO-based substrate which corresponds to the ZnO substrate 1 in the case of FIG. 1. A metal multilayer film 110 is formed on an opposite side of the ZnO-based substrate 100 from the crystal growth surface. The metal multilayer film 100 is a laminated body formed by sequentially laminating a Ti (titanium) film and a Pt (platinum) film on the ZnO-based substrate 100.

Then, in the configuration of FIG. 8, the ZnO-based substrate 100 provided with the metal multilayer film 110 is fitted to a substrate holder 120. In the configuration of FIG. 9, the ZnO-based substrate 100 is fitted to a substrate holder 130. The temperature of the substrate is raised equal to a predetermined growth temperature by applying heat to the substrate with a heat source 140 such as a heater, and the substrate temperature at this time is measured with an infrared thermometer (a pyrometer) 160.

ZnO is almost translucent to light from a visible light range to a wavelength of about 8 μm. If the metal multilayer film 110 is not provided, the pyrometer (which measures infrared rays on a measurement object) configured to monitor the substrate temperature generally measures the temperature of something behind the ZnO-based substrate 100, i.e., the temperature of the substrate holder 120 in FIG. 8, and the temperature of the heat source 140 in FIG. 9.

Formation of a metal thin film is effective for cutting the infrared rays off anything behind the ZnO-based substrate 100. However, since ZnO is deposited in an oxidizing atmosphere, a material such as Ti, Ni, W or Ta which is susceptible to oxidation cannot be used. Pt and Au are metals which are resistant to oxygen and to a temperature exceeding 750° C. However, Pt comes off an oxide very easily, and often causes particles. For this reason, Pt is attached fast to ZnO by inserting Ti as "glue" relatively thinly between Pt and ZnO, followed by annealing. When the ZnO-based substrate 100 is heated, Pt fast attached to ZnO is heated to the same temperature as the ZnO-based substrate 100 is heated, and radiates infrared rays by itself while cutting the infrared rays off anything located behind the ZnO-based substrate 100. Hence, the substrate temperature can be accurately monitored with the pyro-monitor 160. When we measured the substrate temperature at emissivity of 0.18, a value closest to the actual temperature was able to be obtained.

The above-described pyrometer 160 using InGaAs as a detector employs a wavelength of around several micrometers as a detection wavelength. Accordingly, as described previously, the pyrometer 160 is incapable of measuring the temperature of the substrate accurately in the case where: the substrate is the ZnO-based substrate having high transparency to the infrared range; and the substrate includes the ZnO-based thin film having high transparency to the infrared range. For this reason, the metal multilayer film 110 formed of the Ti film and the Pt film is provided as described above.

On the other hand, a thermograph has wavelength sensitivity in a range from about 8 pin to 14 µm, and is capable of performing a temperature measurement starting from a room temperature. The thermograph is suitable for measuring the temperature of the ZnO-based substrate, the ZnO-based thin film or the like. As is well known, the thermograph is an apparatus capable of analyzing infrared rays radiated from an object, and visualizing thermal distribution in the form of a diagram. When the thermograph is used, the thermograph analyzes the infrared rays radiated from the ZnO-based substrate 100, and thus measures the thermal distribution of the substrate 100 heated with the heat source 140.

For example, transmittance of the infrared rays having a wavelength of 8 µm, which are transmitted through the ZnO-based substrate 100, is several percent. When the ZnO-based substrate 100, on which no metal multilayer film 110 is formed, is observed as a single body with the thermograph, this substrate looks black. In short, infrared rays, which are radiated from the object located behind the ZnO-based substrate 100 from the thermograph, are cut off by the ZnO-based substrate 100. As a result, the thermograph can measure the substrate temperature with high accuracy on the basis of infrared rays that are radiated from the ZnO-based substrate 100.

Note that when the thermograph is used, it is preferable that the thermograph should include a bolometer-type infrared detector. That is because a non-cooling type infrared thermograph, which uses a thermal-type infrared detector such as a bolometer-type infrared detector or a collector-type infrared detector, can achieve downsizing, weight saving and price reduction, as compared to a thermograph including an infrared array sensor using a quantum-type infrared detector which needs to be cooled.

On the other hand, the actual temperature is measured by adhering Au/Si, Al/Si, and Al to the substrate by using In. The Au/Si is mixed together (referred to as "forms a eutectic mixture") at 363° C., while the Al/Si is mixed together at 577° C. Al is melted at 660° C. These values remain invariant regardless of the experimental environment, because the phenomena take place at their respective thermodynamically-determined temperatures. For this reason, the values are very suitable for measuring the actual temperature.

Thereafter, the ZnO substrate 1 provided with the above-described metal structure body (the metal multilayer film 110) on the rear surface is put into a load lock chamber. The ZnO substrate 1 is subsequently heated therein at 200° C. for 30 minutes in a vacuum environment of about $1\times10^{-5}$ to $1\times10^{-6}$ Torr in order to remove moisture from the substrate. Afterward, the substrate is introduced to a growth chamber having wall surfaces, which are cooled with liquid nitrogen, via a transfer chamber under vacuum of around $1\times10^{-9}$ Torr. Thereafter, the ZnO-based thin film is growth by MBE.

Zn is supplied in the form of a Zn molecular beam by heating and thus sublimating 7N high-purity Zn at temperature of about 260° C. to 280° C. by use of a Knudsen cell (a molecular beam cell) placed in a crucible made of pBN. Mg is an example of 2A group elements. Mg is also supplied in the form of a Mg molecular beam by heating and thus subliming 6N high-purity Mg at temperature of 300° C. to 400° C. from a Knudsen cell having a similar structure.

On the other hand, as an oxygen source, oxygen is supplied in the form of an O radical, which has enhanced reaction activity, by: supplying 6N $O_2$ gas to a RF radical cell provided with a discharge tube having a small orifice at a portion of a cylinder via a SUS pipe having an electrolytically polished inner surface at a rate of about 0.1 sccm to 5 sccm; applying an RF high-frequency wave of about 100 to 300 W to the 6N $O_2$ gas in the RF radical cell; and thereby producing a plasma from the resultant 6N $O_2$ gas. The plasma is important, because the ZnO thin film is not formed by putting raw $O_2$ gas.

In order to heat the substrate, a SiC coated carbon heater is used in the case of ordinary resistance heating. A metallic heater made of W or the like is oxidized, and is therefore unusable. Other heating methods include lamp heating, laser heating and the like. Any of these methods is applicable as long as the method is resistant to oxidation.

After heating the substrate at the temperature of 750° C. or higher under vacuum of about $1\times10^{-9}$ Torr for about 30 minutes, the ZnO thin film growth is started by opening the shutters of the oxygen radical cell and the Zn cell. At this time, the temperature of 750° C. or higher is necessary for obtaining a flat film regardless of what kind of film is to be formed. Moreover, after crystal-growing the undoped ZnO layer 2, the growth of the MgZnO/ZnO superlattice component 3 is started.

When Mg is supplied, the amount of supplied Mg is changed depending on the cell temperature. Thereby, the Mg composition is adjusted. Since the Mg composition originally depends on a ratio of supplied Zn to supplied O, the amount of supplied Mg for obtaining the same composition may vary depending on growth conditions. In our case, it is possible to adjust the composition in a range of 0% to 35% by setting the temperature of the Mg cell in a range of 250° C. to 400° C., and the amount of supplied Mg in a range of $1\times10^{-9}$ Torr to $1\times10^{-7}$ Torr.

The acceptor doping is performed as follows. When nitrogen is used as the dopant, a radical cell having a structure similar to that of the radical cell used for oxygen is used. NO gas is supplied in a range of 0.1 to 1 sccm. The RF is applied in a range from 100 to 500 W. However, the conditions vary depending on the size of the chamber and the size of the radical cell. Therefore, the above-mentioned conditions are not always definite. When NO gas is used, nitrogen-doped ZnO or MgZnO can be produced by supplying only the NO gas. Meanwhile, when copper is used as the dopant, copper is supplied in the form of a Cu molecular beam by heating and sublimating Cu by use of a Knudsen cell as in the case of the supply of Zn.

After growing the nitrogen-doped ZnO layer 3a in a thickness of about 1 to 10 nm, the nitrogen-doped MgZnO layer 3b can be formed by opening the Mg cell shutter. By repeatedly opening and closing the Mg cell shutter at intervals of a predetermined time, it is possible to form the laminate structure including the ZnO layers 3a and the MgZnO layers 3b. Thereby, the superlattice structure is produced. Next, the Mg cell shutter is opened, whereas a shutter for the nitrogen radical cell is closed. Thereby, the undoped MgZnO layer 4 is formed.

Figure 6:
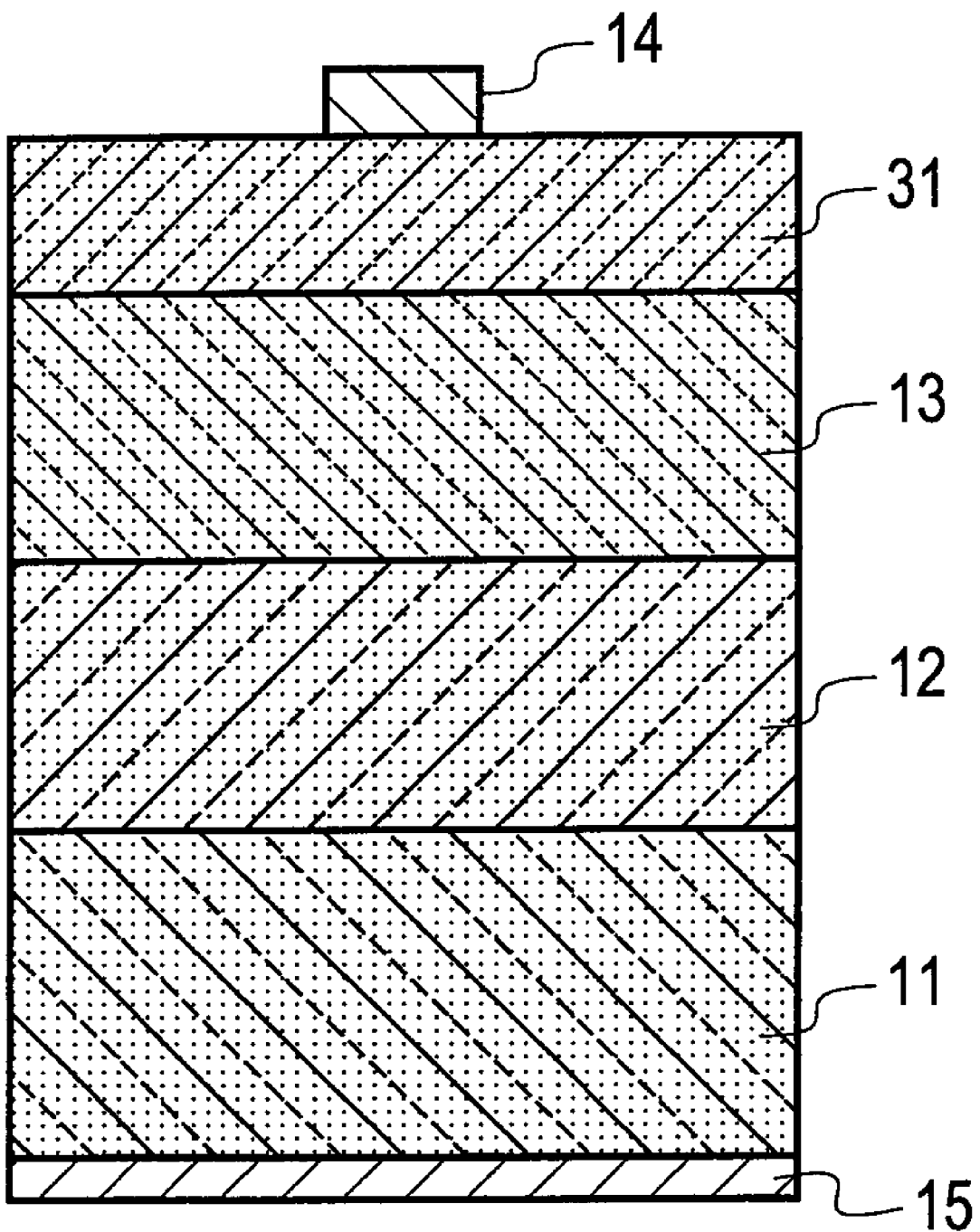
FIG. 6 is a view showing an example of a ZnO-based semiconductor device using the MgZnO/ZnO superlattice component of the present invention.
Figure 7:
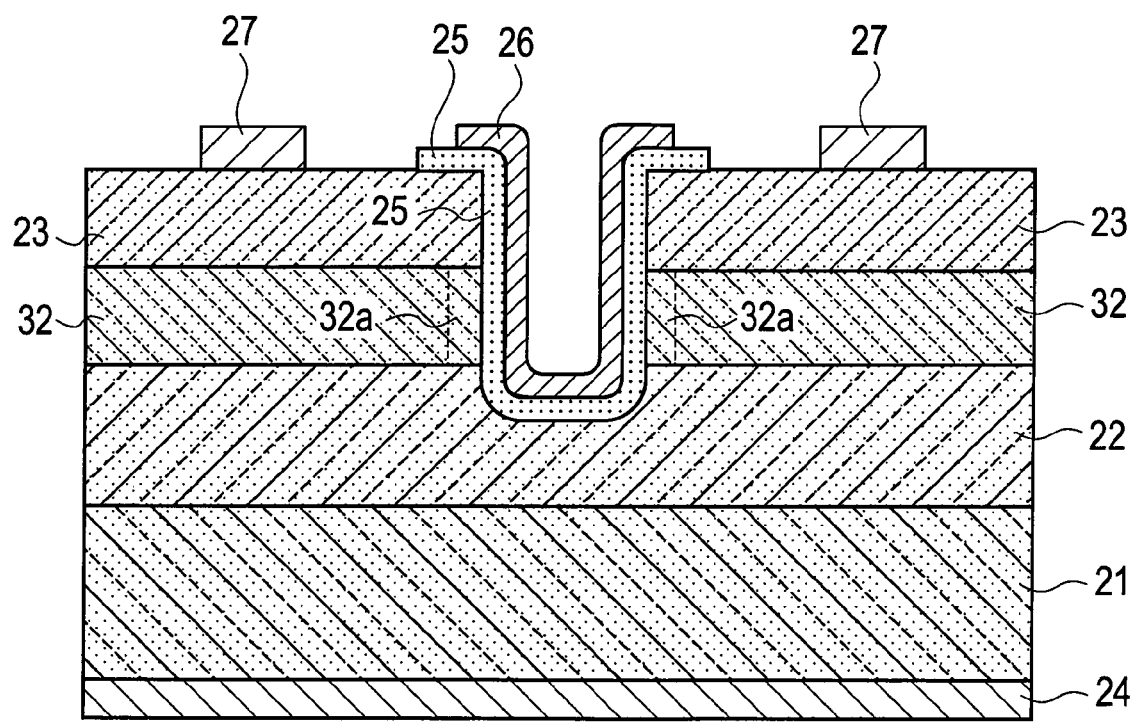
FIG. 7 is a view showing another example of the ZnO-based semiconductor device using the MgZnO/ZnO superlattice component of the present invention.

Next, FIGS. 6 and 7 show examples of the ZnO-based semiconductor device using the p-type MgZnO/ZnO superlattice component 3 which results from the acceptor doping as described above.

FIG. 6 is an example of a LED device using the MgZnO/ZnO superlattice component 3 and a ZnO-based semiconductor layer. An n-type MgZnO layer 12, a MgZnO/ZnO active layer 13 and a MgZnO/ZnO superlattice component 31 are laminated on a conductive $Mg_yZn_{1-y}O$ ($0 \leq Y < 1$) substrate 11. The MgZnO/ZnO superlattice component 31 is the above-described MgZnO/ZnO superlattice component 3 of the present invention. Moreover, a p-electrode 14 is formed on the MgZnO/ZnO superlattice component 31, and an n-electrode 15 is formed on a rear surface of the MgZnO substrate 11.

The Mg composition ratios, the film thicknesses and the like of the respective ZnO-based semiconductor layers to be formed on the MgZnO substrate 11 are configured as follows, for example. The n-type MgZnO layer 12 is doped with Ga as the donor with a 15-percent Mg composition ratio. The MgZnO/ZnO active layer 13 has a multiple quantum well structure formed by alternately laminating an undoped $Mg_{0.07}ZnO$ barrier layers having a film thickness of 5 nm and an undoped ZnO well layers having a film thickness of 2 nm from an n-side several times. The p-type MgZnO/ZnO superlattice component 31 has a superlattice structure formed by alternately laminating an undoped ZnO layer having a film thickness of 5 nm and a nitrogen-doped $Mg_{0.01}ZnO$ layer having a film thickness of 5 nm from the active layer side. The p-electrode 14 is formed of an Au/Ni multilayered metal film having a diameter of 100 μm, while the n-electrode 15 is formed of a Ti/Au multilayered metal film.

As described above, the LED shown in FIG. 6 has a double hetero structure formed by interposing the MgZnO/ZnO active layer 13 between the p-type MgZnO/ZnO superlattice component 31 and the n-type MgZnO layer 12. The MgZnO/ZnO active layer emits light by applying a forward bias between the p-electrode 14 and the n-electrode 15, and this light is outputted in a direction toward the p-electrode 14.

Next, a ZnO-based semiconductor device shown in FIG. 7 shows an example of a MOSFET (metal oxide semiconductor field effect transistor). This MOSFET has a N-P-N structure on a conductive $Mg_yZn_{1-y}O$ ($0 \leq Y < 1$) substrate 21. The N-P-N structure is formed by laminating an n-type MgZnO layer 22, a p-type MgZnO/ZnO superlattice component 32 and an n-type ZnO layer 23. The MgZnO/ZnO superlattice component 32 is the above-described MgZnO/ZnO superlattice component 3 of the present invention.

In this respect, the n-type MgZnO layer 22 corresponds to a drain layer, the MgZnO/ZnO superlattice component 32 corresponds to a channel layer, and the n-type ZnO layer 23 corresponds to a source layer. A U-shaped groove (trench) is formed at a central portion of the wafer, and a gate insulating film 25 is formed extending from this U-shaped trench to a surface of the n-type ZnO layer 23. A gate electrode 26 is formed on the gate insulating film 25 in a region where the gate insulating film 25 is formed (in a MOS structure). Meanwhile, a source electrode 27 is formed on the same surface side as the gate electrode 26 (the front surface side) is formed, and a drain electrode 24 is formed on an entire rear surface of the wafer in a way to be opposed to the source electrode 27.

The constituents in FIG. 7 are formed as follows, for example. The n-type MgZnO drain layer 22 is doped with Ga as the donor with a Mg composition ratio of 5% to 35%. Alternatively, this drain layer may be formed as an undoped MgZnO layer instead of the n-type MgZnO layer. The MgZnO/ZnO superlattice component 32 has a superlattice structure formed by alternately laminating a nitrogen-doped ZnO layer having a film thickness of 50 nm to 300 nm, and a nitrogen-doped $Mg_xZnO$ layer (x in a range of 0.05 to 0.1) having a film thickness of 50 nm to 300 nm from the drain layer side. The n-type ZnO source layer 23 is doped with Ga as the donor. The gate insulating film 25 is made of $SiO_2$ or the like. The gate electrode 26, the source electrode 27 and the drain electrode 24 are each made of Ti/Au a multilayered metal film.

The ZnO-based semiconductor devices as shown in FIG. 7 are each formed by MBE as in the case shown in FIG. 1. Here, procedures will be briefly explained. The MgZnO substrate 21 is put into the load lock chamber, and is heated at 200° C. for about 30 minutes in a vacuum environment of about $1 \times 10^{-5}$ to $1 \times 10^{-6}$ Torr in order to remove moisture from the substrate. The substrate is introduced to the growth chamber having the wall surfaces, which are cooled with liquid nitrogen, via the transfer chamber under vacuum of around $1 \times 10^{-9}$ Torr. The drain layer 22 which is either Ga-doped or undoped, the nitrogen-doped MgZnO/ZnO superlattice component 32 and the n-type ZnO layer are crystal-grown sequentially. The Ga doping concentration for the N-type ZnO layer 23 is in a range of $10^{17}$ to $10^{19}$ cm$^{-3}$.

The N-P-N laminated body thus produced is subjected to mesa etching by use of HCl or $HNO_3$. Thereby, the U-shaped trench is formed. Subsequently, the gate insulating film 25 is formed extending from the U-shaped trench to the surface of the n-type ZnO layer 23 by PECVD. Thereafter, the gate electrode 26, the source electrode 27 and the drain electrode 24 are produced either by sputtering or vapor deposition.

Brief descriptions will be hereinbelow provided for an operation of the MOSFET thus formed. A reverse bias voltage is applied between the source electrode 27 and the drain electrode 24 so as positively polarize the drain electrode 24. Thereby, the reverse voltage is applied to a p-n junction formed by the n-type MgZnO drain layer 22 and the p-type MgZnO/ZnO superlattice channel layer 32. At this time, the source and the drain are electrically disconnected. Once a predetermined voltage is applied between the source electrode 27 and the gate electrode 26 with the source and the drain being electrically disconnected so as to positively polarize the gate electrode 26, electrons are excited and an inversion channel is thus formed in a channel region 32a in the p-type MgZnO/ZnO superlattice channel layer 32.

The n-type MgZnO drain layer 22 is electrically conducted with the n-type ZnO source layer 23 through this inversion channel 32a. Thereby, electrons move from the source electrode 27 to the drain electrode 24 through the channel region 32 (an electric current flows on an oppositely-directed pathway), and the source and drain are thus electrically connected together. As described above, the source and drain are electrically connected together, when the predetermined bias is applied to the gate electrode 26. On the contrary, the source and drain are electrically disconnected, when the bias is not applied to the gate electrode 26.

The invention claimed is:

1. A ZnO-based thin film which is a p-type superlattice component with a repeatedly laminated structure of a MgZnO layer and a ZnO layer, wherein
   the repeatedly laminated structure includes a plurality of repetitions of a combination of a MgZnO layer and a ZnO layer, and
   the MgZnO layers are doped with an acceptor and the ZnO layers are not intentionally doped with the acceptor.

2. The ZnO-based thin film according to claim 1, wherein a Mg composition ratio of the MgZnO layer is not higher than 50%.

3. The ZnO-based thin film according to claim 1, wherein a Mg composition ratio of the MgZnO layer is not higher than 30%.

4. The ZnO-based thin film according to claim 1, wherein film thicknesses of the respective layers in the superlattice component are not more than 10 nm.

5. The ZnO-based thin film according to claim 1, wherein the acceptor is any one of nitrogen and copper.

6. A ZnO-based semiconductor device comprising a laminated body containing ZnO-based semiconductor in which the ZnO-based thin film according to claim 1 is used as a p-type layer.

7. The ZnO-based semiconductor device according to claim 6, wherein
   the laminated body contains a $Mg_Y Zn_{1-Y} O$ ($0 \leq Y < 1$) substrate and an n-type MgZnO layer disposed on the $Mg_Y Zn_{1-Y} O$ ($0 \leq Y < 1$) substrate and a MgZnO/ZnO active layer disposed on the n-type MgZnO layer and the superlattice component disposed on the MgZnO/ZnO active layer.

8. The ZnO-based semiconductor device according to claim 6, wherein
   the laminated body contains a $Mg_Y Zn_{1-Y} O$ ($0 \leq Y < 1$) substrate and an n-type MgZnO layer disposed on the $Mg_Y Zn_{1-Y} O$ ($0 \leq Y < 1$) substrate and a superlattice component disposed on the n-type MgZnO layer and an n-type ZnO layer disposed on the superlattice component.

* * * * *